(12) United States Patent
Sutedja et al.

(10) Patent No.: US 7,626,681 B2
(45) Date of Patent: Dec. 1, 2009

(54) LITHOGRAPHIC APPARATUS AND METHOD

(75) Inventors: Budiman Sutedja, Venlo (NL); Rudy Jan Maria Pellens, Overpelt (BE); Johannes Paulus Adrianus Maria Van Den Heuvel, Heeze (NL); Paulus Wilhelmus Leonardus Van Dijk, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 505 days.

(21) Appl. No.: 11/319,192

(22) Filed: Dec. 28, 2005

(65) Prior Publication Data
US 2007/0146679 A1 Jun. 28, 2007

(51) Int. Cl.
G03B 27/58 (2006.01)
G03B 27/42 (2006.01)
H01L 21/683 (2006.01)
G03G 15/02 (2006.01)

(52) U.S. Cl. .................. 355/72; 355/53; 361/234; 361/235

(58) Field of Classification Search .................. 355/53, 355/72, 75; 361/234, 235
See application file for complete search history.

(56) References Cited

U.S. PATENT DOCUMENTS

| 4,412,133 | A | * | 10/1983 | Eckes et al. ............. 250/492.2 |
| 4,999,507 | A | * | 3/1991 | Clemens et al. .......... 250/492.2 |
| 6,215,642 | B1 | * | 4/2001 | Sogard ...................... 361/234 |
| 6,583,858 | B2 | | 6/2003 | van Schaik et al. |
| 6,864,957 | B2 | | 3/2005 | Van Elp et al. |
| 7,372,561 | B2 | * | 5/2008 | Shibata et al. ........... 356/237.5 |
| 7,408,624 | B2 | * | 8/2008 | Van De Moosdijk et al. .. 355/72 |
| 7,494,828 | B2 | * | 2/2009 | Best et al. .................. 438/14 |
| 2003/0164934 | A1 | * | 9/2003 | Nishi et al. ................. 355/72 |
| 2004/0114124 | A1 | | 6/2004 | Hoeks et al. |
| 2004/0259326 | A1 | * | 12/2004 | Hideo ...................... 438/458 |
| 2005/0093378 | A1 | * | 5/2005 | Ohishi ....................... 310/12 |
| 2006/0158823 | A1 | * | 7/2006 | Mizuno et al. ............. 361/234 |

OTHER PUBLICATIONS

K. Bock et al., New Manufacturing Concepts for Ultra-Thin Silicon and Gallium Arsenide Substrates, Fraunhofer Institute for Reliability and Microintegration, International Conference on Compound Semiconductor Mfg., (2003).

K. Bock et al., Characterization of Electrostatic Carrier Substrates to be Used as a Support for Thin Semiconductor Wafers, Fraunhofer Institute for Reliability and Microintegration, (2005).

* cited by examiner

Primary Examiner—Alan A Mathews
(74) Attorney, Agent, or Firm—Pillsbury Winthrop Shaw Pittman LLP

(57) ABSTRACT

According to an aspect of the present invention, there is provided a lithographic apparatus that includes a substrate carrier arranged to hold a substrate in position using an electrostatic force. The substrate carrier is provided with an integral power source. The apparatus also includes a substrate table for holding the substrate carrier.

19 Claims, 4 Drawing Sheets

LITHOGRAPHIC APPARATUS AND METHOD

FIELD

The present invention relates to a lithographic apparatus and method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

A lithographic apparatus is usually provided with a substrate table which is arranged to hold a conventional substrate in position. When the substrate is a non-standard size or shape (i.e. irregular) it is difficult or impossible to hold the substrate in position as the substrate table is not configured to hold an irregular substrate. Similarly, in processing outside of the lithographic apparatus (e.g. cleaning of the substrate), apparatus is commonly configured to accommodate conventional substrates, making it difficult or impossible to hold an irregular substrate in position during such processing. To solve these problems, the irregular substrate may be bonded (e.g. glued) to a standard substrate, and the standard substrate is then held in position in a conventional manner. The standard substrate then becomes a substrate carrier. However, the bonding of the irregular substrate to a regular substrate is not ideal.

SUMMARY

It is an object of the present invention to provide a new apparatus and method for attaching a substrate to a substrate carrier.

According to an aspect of the invention, there is provided a lithographic apparatus that includes a substrate carrier arranged to hold a substrate in position using an electrostatic force. The substrate carrier is provided with an integral power source. The apparatus also includes a substrate table for holding the substrate carrier.

According to an aspect of the invention, there is provided a substrate carrier arranged to hold a substrate in position using an electrostatic force, wherein the substrate carrier is provided with an integral power source.

According to an aspect of the invention, there is provided a lithographic processing method that includes introducing a substrate and substrate carrier into a lithographic apparatus while the substrate is held in position on the substrate carrier using an electrostatic force, applying a pattern to the substrate using optical lithography, and removing the substrate and substrate carrier from the lithographic apparatus while the substrate is still held in position on the substrate carrier using an electrostatic force.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" as used herein encompass all types of electromagnetic radiation, including ultra-violet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" as used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure supports, i.e. bears the weight of, the patterning device. It holds the patterning device in a way depending on the orientation of the patterning device, the design of the lithographic apparatus, and other conditions, such as for example whether or not the patterning device is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or of a vacuum. Any use of the term "lens" herein may be considered as synonymous more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

EMBODIMENTS

Figure 1:
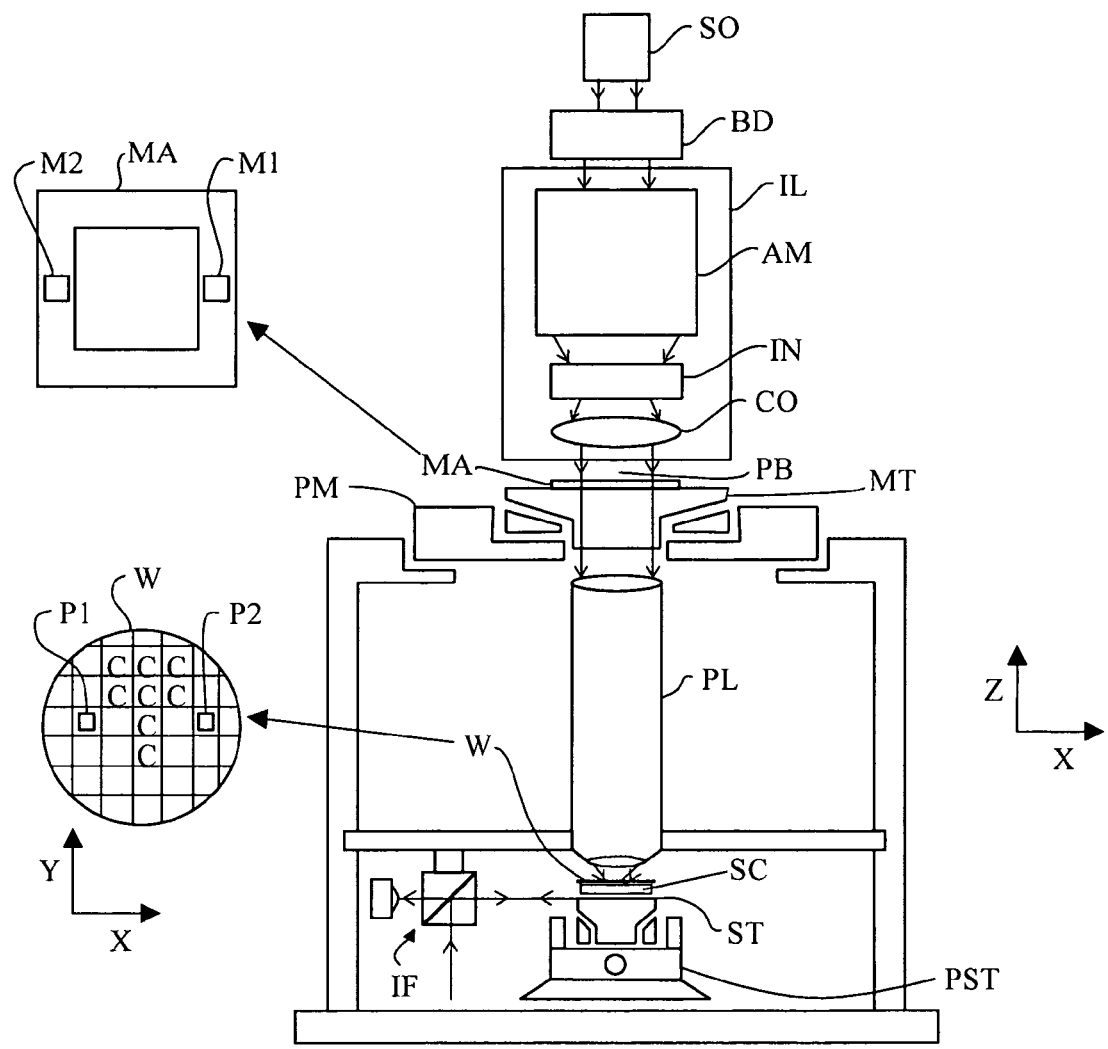
FIG. 1 depicts a lithographic apparatus provided with a substrate carrier according to an embodiment of the invention.

FIG. 1 schematically depicts a lithographic apparatus according to a particular embodiment of the invention. The apparatus comprises an illumination system (illuminator) IL for providing a projection beam PB of radiation (e.g. UV radiation or EUV radiation); a first support structure (e.g. a mask table) MT for supporting a patterning device (e.g. a mask) MA and connected to a first positioner PM for accurately positioning the patterning device with respect to item PL; a substrate table ST for holding a substrate carrier SC, the substrate table being connected to a second positioner PST for accurately positioning the substrate table ST (and thus the substrate carrier SC) with respect to item PL; and a substrate carrier SC for holding a substrate (e.g. a resist-coated wafer) W, the substrate carrier SC being readily removable from the lithographic apparatus and introducible into the lithographic apparatus; a projection system (e.g. a refractive projection lens) PL for imaging a pattern imparted to the projection beam PB by the patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The source SO and the illuminator IL, together with the beam delivery system BD if required, may be referred to as a radiation system.

The illuminator IL may comprise an adjuster AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioner PST and position sensor IF (e.g. an interferometric device), the substrate table ST can be moved accurately, e.g. so as to position different target portions C in the path of the beam PB. Similarly, the first positioner PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and ST will be realized with the aid of a long-stroke module (coarse positioning) and a short-stroke module (fine positioning), which form part of the positioners PM and PST. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table ST are kept essentially stationary, while an entire pattern imparted to the projection beam is projected onto a target portion C in one go (i.e. a single static exposure). The substrate table ST is then shifted in the X and/or Y direction so that a different target portion C can be exposed. In step mode, the maximum size of the exposure field limits the size of the target portion C imaged in a single static exposure.

2. In scan mode, the mask table MT and the substrate table ST are scanned synchronously while a pattern imparted to the projection beam is projected onto a target portion C (i.e. a single dynamic exposure). The velocity and direction of the substrate table ST relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table ST is moved or scanned while a pattern imparted to the projection beam is projected onto a target portion C. In this mode, generally a pulsed radiation source is employed and the programmable patterning device is updated as required after each movement of the substrate table ST or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

In known lithographic apparatus, an irregular substrate to be exposed is bonded to a substrate carrier (e.g. a conventional substrate). The substrate carrier and substrate bonded to the substrate carrier is loaded into the lithographic apparatus and placed on the substrate table. A vacuum is established between the substrate table and substrate carrier such that the substrate carrier (and thus the substrate) is held in position relative to the substrate table. The substrate is exposed, and then the vacuum is removed. The substrate and substrate carrier to which it is bonded may then be removed from the substrate table. Before and/or after exposure of the substrate, additional processing may take place while the substrate is bonded to the substrate carrier.

While the bonding of the irregular substrate to the substrate carrier may allow the irregular substrate to be exposed (etc.) using apparatus configured to accommodate a standard substrate, bonding is not always an ideal solution. For example, once bonded to the substrate carrier, it is difficult to reposition the substrate. To bond the irregular substrate to the substrate carrier requires processing steps (e.g. a gluing and curing step), which can introduce undesirable time delays in the processing of the substrate.

FIG. 1 depicts an embodiment of the present invention. In FIG. 1, the substrate W is illustrated as being fixed to a substrate carrier SC. The substrate carrier SC is held in position by the substrate table ST. The substrate carrier SC may be held in position using any suitable technique, for example by the use of a vacuum, mechanical clamping or electrostatic clamping. The substrate table ST is provided with mirrors (not shown) which form part of an interferometric device IF used to accurately position the substrate table ST, and consequently the substrate carrier SC and substrate W which is attached thereto.

The substrate carrier SC of FIG. 1 is readily removable from the lithographic apparatus and introducible into the lithographic apparatus in much the same way as the substrate W of a conventional system. The substrate carrier SC holds the substrate W in position using electrostatic forces (in a manner described in more detail below), such that the substrate carrier SC and substrate W can be moved around without the substrate W becoming detached from the substrate carrier SC. Thus, as the substrate carrier SC is readily removable from and introducible into the lithographic apparatus, the substrate W can be introduced into the lithographic apparatus and removed from the lithographic apparatus while it is attached to the substrate carrier SC. This allows processing of the substrate W prior to and/or after exposure in the lithographic apparatus to be undertaken while the substrate W is attached to (using electrostatic forces) and supported by the substrate carrier SC. Furthermore, this obviates the need to bond the substrate to the substrate carrier.

Figure 2A:
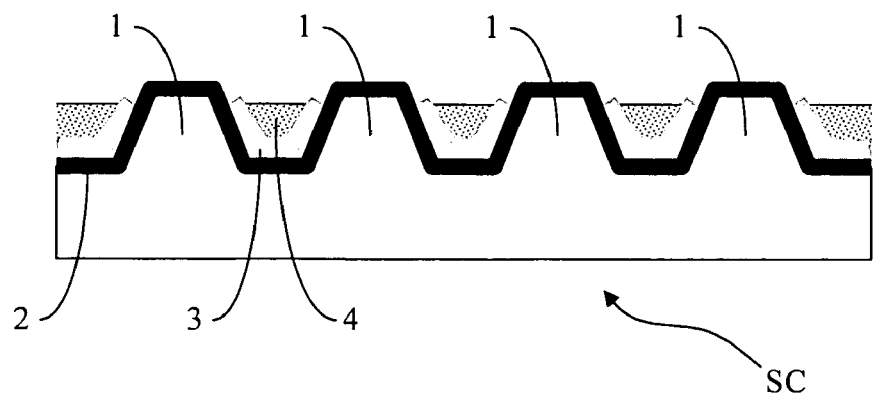
FIGS. 2a to 2c depict the substrate carrier of FIG. 1 in more detail.

FIG. 2a depicts the substrate carrier SC of FIG. 1 in more detail. The substrate carrier SC is formed from a disc-shaped piece of glass having an array of squared shaped protrusions 1 protruding therefrom (the protrusions 1 are similar to pimples of conventional pimple tables). The disc-shaped piece of glass is comparable in shape and size to a conventional substrate, such that apparatus designed to accommodate a conventional substrate may accommodate the substrate carrier SC. The substrate carrier SC is provided with a layer of diamond-like carbon 2. The diamond-like carbon layer 2 serves as a conductor and a protective surface for the glass of the substrate carrier SC. A layer of electrical insulator 3 is deposited on top of the layer of diamond-like carbon 2. The layer of electrical insulator 3 does not cover the tops of the protrusions 1, but coats recesses which are formed between the protrusions 1. On top of the layer of electrical insulator 3 is deposited a layer of metal 4. The layer of metal 4 is not deposited on top of the protrusions 1, but in the recesses formed between the protrusions 1. The metal layer 4 is electrically insulated from the diamond-like carbon layer 2 by the layer of electrical insulator 3.

As can be seen from FIG. 2a, when the layers of electrical insulator 3 and metal 4 have been provided on the substrate carrier SC, the protrusions 1 still protrude from the layer 3, 4 (i.e. an air gap is provided). By providing an air gap, an object (e.g. a substrate) lying on the substrate carrier SC will only contact the protrusions 1 coated in diamond-like carbon 2, and not the metal layer 4, thereby preventing the substrate from forming a short circuit between the diamond-like carbon layer 2 and the metal layer 4. It will be appreciated that the air gap could also be filled with a dielectric layer having a higher dielectric constant than air. Preferably, the air gap is only partially filled with a dielectric so that the contact area between the substrate carrier SC and the substrate W (not shown in this FIG.) is minimized.

Figure 2B:
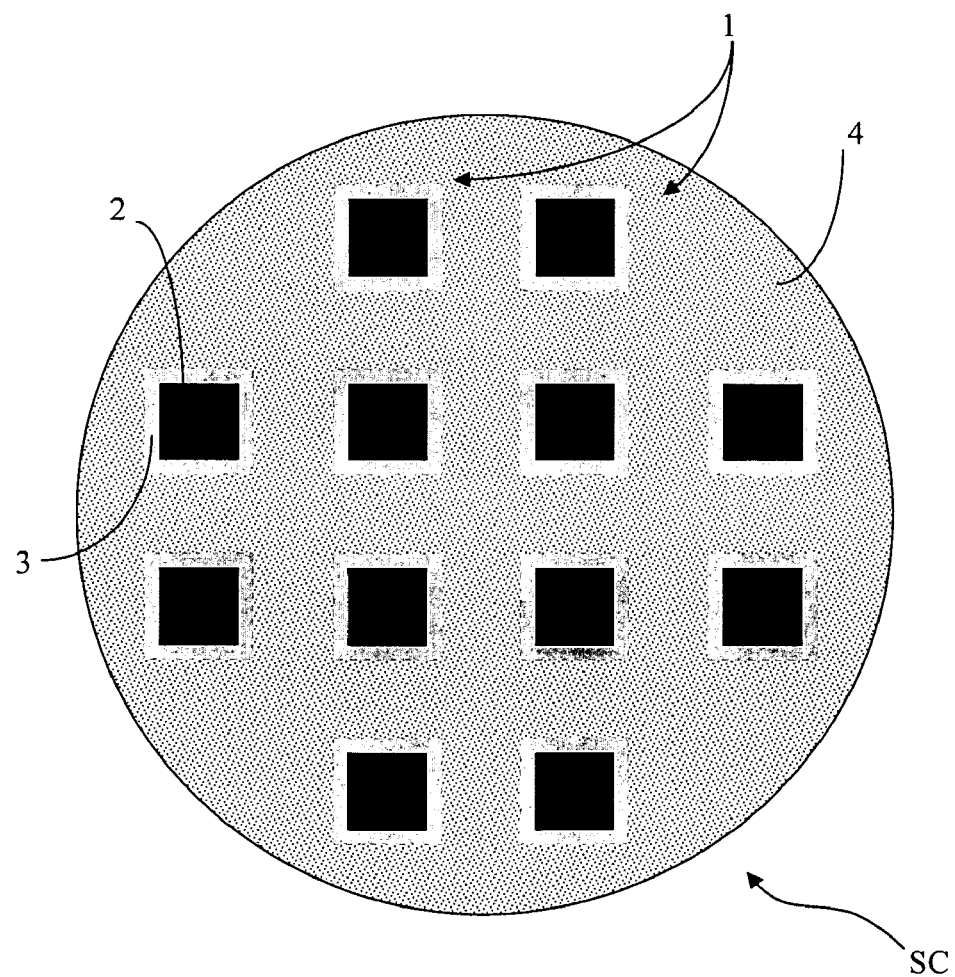

A plan view of the substrate carrier SC is shown in FIG. 2b. It can be seen that the protrusions 1 form a matrix. It can also be seen that the metal layer 4 forms a 'grid', which extends across the surface of the substrate carrier SC and about the protrusions 1 of the substrate carrier SC.

It will be appreciated that all figures described herein are given by way of example only, and are to be used as aids in understanding the present invention only. For example, FIG. 2b illustrates the substrate carrier SC having twelve protrusions 1 protruding therefrom. However, it will be appreciated that the number of protrusions 1 on the substrate carrier SC may be less than twelve or greater than twelve.

Figure 2C:
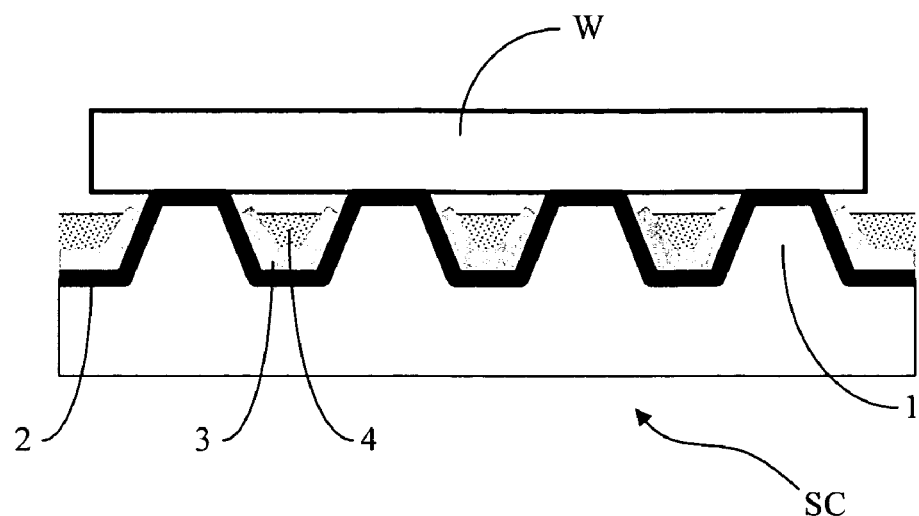

FIG. 2c shows the substrate carrier SC of FIG. 2a in use. In use, a substrate W is placed on top of the protrusions 1 of the substrate carrier SC. A potential difference is established between the metal layer 4 and diamond-like carbon layer 2. An electrostatic force is generated which holds the substrate W in position on the protrusions 1. Even when no potential difference is actively applied to the substrate carrier SC (e.g. when the substrate carrier SC is not attached to a power supply), a residual electrostatic force will remain, although this will diminish over time due to charge leakage. Thus, even when there is no potential difference being actively applied to the substrate carrier SC, the substrate W will still be held thereon for a certain time period (the duration of which will be determined by properties of the substrate carrier SC). During this time period, the substrate W and substrate carrier SC may be moved around together (including being introduced into the lithographic apparatus or removed therefrom), and the substrate W processed while it is still attached to the substrate carrier SC.

Although the substrate carrier SC of FIG. 2 holds the substrate W in position, the substrate W is only held in position for a certain period of time. The substrate W is only held in position for a certain period of time because there is typically some amount of leakage of electrical charge, i.e. charges in the layers (e.g. the metal layer 4 and diamond-like carbon layer 2) will only remain 'separated' for a certain period of time. Thus, in order to keep the substrate W held in position on the substrate carrier SC, the substrate carrier SC should be periodically charged (i.e. an active power supply or source is needed).

Figure 3A:
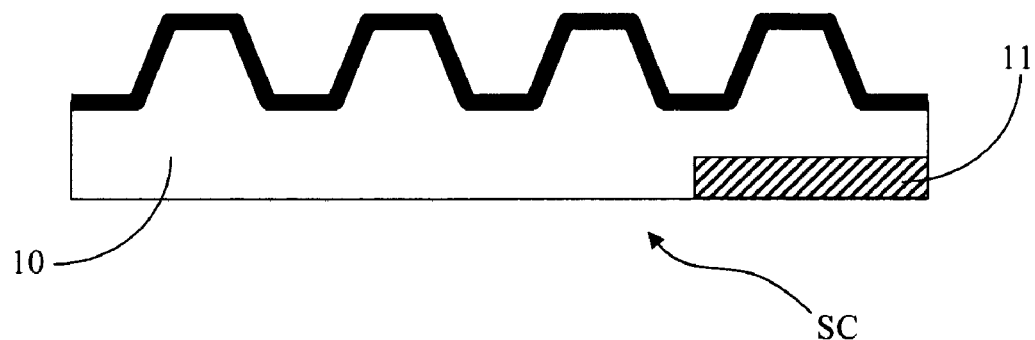
FIGS. 3a to 3c depict an alternative embodiment of the substrate carrier.

FIG. 3a illustrates a substrate carrier SC in accordance with another embodiment of the present invention. The substrate carrier SC of FIG. 3a is shown in a simplified format to aid understanding of the present embodiment. The substrate carrier SC comprises a support structure 10 on which the substrate is to be held in position. This embodiment differs from that described in relation to FIGS. 2a to 2c in that the substrate carrier SC is now provided with an internal power source 11 arranged to apply a potential difference to appropriate layers of the substrate carrier. In this embodiment, the internal power source is a battery 11. The battery 11 may be a polymer battery. The battery 11 is integral to the substrate carrier SC, insofar as that the battery 11 is a part of the substrate carrier SC. For example, the battery 11 and substrate carrier SC may be moved about simultaneously. The battery 11 may be manufactured separately from the substrate carrier SC and then attached to the support structure 10 by known methods so that it becomes integral with the substrate carrier SC. It is also contemplated that the battery 11 may be manufactured along with the substrate carrier SC such that it is part of the substrate carrier SC as it is created. The embodiments illustrated and described herein should not be considered to be limiting in any way.

The substrate W may be held in position on the substrate carrier SC as described above, but the period for which the substrate W is held on the substrate carrier SC is now prolonged by the provision of the battery 11. As the battery is integral to the substrate carrier SC no external source of power is required to achieve the prolonging effect.

It will be appreciated that the battery may need to be charged from time to time, and such charging may be undertaken at any suitable time. For example, charging of the battery may be undertaken when the substrate carrier SC is not in use. The battery 11 could be charged using an induction coil for example (not shown). Alternatively, the battery 11 may be replaced with a new or newly charged battery.

Figure 3B:
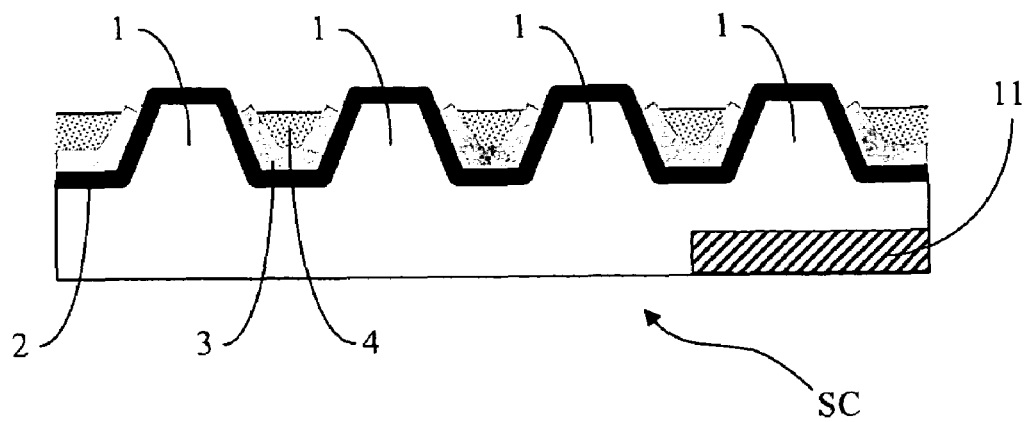
Figure 3C:
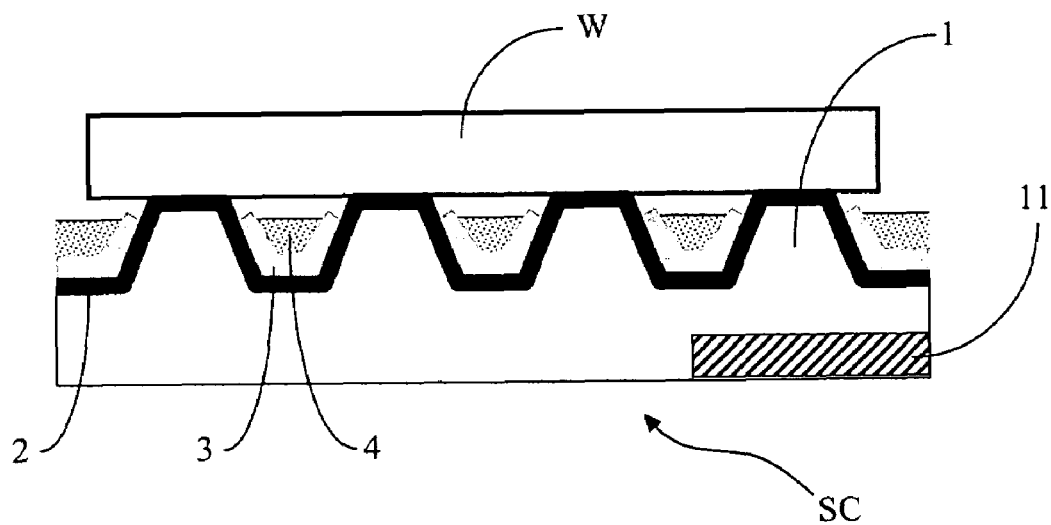

FIG. 3b illustrates the substrate carrier SC of FIG. 3a in more detail. As can be seen from FIG. 3b, the substrate carrier SC of FIG. 3b is identical in form to that of FIG. 2a, but with the provision of the battery 11. FIG. 3c shows the substrate carrier SC of FIG. 3b in use. The substrate carrier SC functions in exactly the same way as the substrate carrier SC of FIG. 2c, but the provision of a battery 11 now prolongs the period for which an electrostatic force is generated in the substrate carrier SC.

An example of the operation of the properties of the substrate carrier SC and battery of FIG. 3c is now given. For a circular substrate W of diameter 200 mm, it is assumed that at least 98% of its surface will be actively attracted to the substrate carrier SC, i.e. the substrate W has an active electrostatic area of more than 98% of its total area. Thus, the active area is approximately 0.0308 m$^2$. The dielectric constant is 11, and the thickness of the dielectric is 2 µm. A voltage of 24V is supplied by twenty 1.2 V Lithium batteries 11 connected in series. Each of the batteries 11 has a form factor of 40 µm thickness. By applying a voltage of 24V, an attractive force of 216 N is applied to the substrate W (calculated using known electrostatic formulae). This corresponds to an average pressure over the substrate W of 6869 Nm$^{-2}$ (687 mbar), which is sufficient to hold the substrate W in position on the substrate carrier SC.

It will be appreciated that the above embodiments have been described by way of example only, and various modifications may be made thereto.

The embodiment of FIG. 3a has been described with reference to a battery 11. However, any suitable integral power source may be used. The battery 11 may have a cuboid structure. Alternatively, the battery 11 may be any suitable shape. Most preferably, the integral power source is able to provide a steady voltage for a prolonged period of time.

The protrusions 1 of the above-described embodiments are given by way of example only. The substrate W may be kept from contacting the metal layer 4 by any suitable protrusions. For example, in an alternative arrangement to the matrix of protrusions 1 shown in FIG. 2b, the protrusions may be a single spiral. A single spiral may be easier to fabricate, or easier to connect to the integral power source.

The substrate carrier SC may be of any form suitable for generating an electrostatic force that is capable of holding the substrate W on a surface of the substrate carrier SC. The substrate carrier SC may be formed from any suitable electrically isolating material. For example, the substrate carrier SC may be formed from quartz. Alternatively, the substrate carrier SC may be formed from a material that is not electrically isolating, in which case a layer of electrically isolating material may be deposited thereon. The substrate carrier SC described in relation to FIGS. 2 and 3 is provided with a layer of diamond-like carbon 2. It will be appreciated that the layer of diamond-like carbon 2 may be deposited mainly on the protrusions 1 of the substrate carrier SC, with thin tracks of diamond-like carbon electrically connecting adjacent protrusions 1 (i.e. areas of the substrate carrier SC between protrusions 1 are only covered in a minimal amount of diamond-like carbon). This configuration may be desirable in some circumstances, for example to reduce the amount of stored charge.

In an embodiment, the substrate carrier SC is comparable in thickness to the substrate W. The substrate carrier SC may even be thinner than the substrate W. In an embodiment, the substrate carrier SC is thicker than the substrate W. In an embodiment, the substrate carrier is comparable in size to a conventional substrate. For instance, the substrate carrier may be circular and have a diameter of 100 mm, 150 mm, 200 mm, or 300 mm. In this way, equipment that has been made to accommodate a conventional substrate may also accommodate an irregular substrate W while it is attached to the substrate carrier SC, such that processing of the irregular substrate W may be undertaken while the irregular substrate W is attached to the substrate carrier SC. It will be appreciated that the thickness of the substrate carrier SC will be determined by the thickness of its constituent layers and components (e.g. batteries). The substrate carrier SC may need to be a certain thickness to prevent bending or to provide a mechanical support for the substrate W. For example, the substrate carrier SC may have a thickness of 150 µm or greater.

By providing protrusions 1 which the substrate W rests upon, the substrate carrier SC of the present invention may hold substrates of any suitable size and/or thickness (including regular and irregular substrates). For example, the substrate carrier SC may hold an 18 mm×18 mm square substrate, or a quadrant of a circular substrate (e.g. a quadrant of a circular substrate having a diameter of 2 inches (5.08 cm)). In an embodiment, the substrate W is a semiconductor substrate, e.g. a semiconductor wafer. In an embodiment, the substrate material is selected from the group consisting of Si, SiGe, SiGeC, SiC, Ge, GaAs, GaN, InP, and InAs. In an embodiment, the substrate is a III/V compound semiconductor wafer. In an embodiment, the substrate is a II/IV compound semiconductor wafer. In an embodiment, the substrate is a Quartz, Lithium Niobate (LiNbO3), lithium Tantalate (LiTaO3), or Langasite (La3Ga5SiO14) substrate. In an embodiment, the substrate is a sapphire substrate (e.g. as a carrier for a GaN substrate). In an embodiment, the substrate is a AlTiC substrate. In an embodiment, the substrate is a Mercury Cadmium Telluride (HgCdTe) substrate or a InSb substrate. In an embodiment, the wafer is a silicon wafer. In an embodiment, the substrate is a thin substrate. For instance, the substrate may have a thickness to area ratio of $5*10^{-6}$ or less, e.g. $4*10^{-6}$ or less, $3.5*10^{-6}$ or less, or $3.0*10^{-6}$ or less, for instance a 200 mm circular wafer with a thickness of about 100 micron [$(100\text{ micron}/0.25\pi(200\text{ mm})^2)=3.1*10^{-6}$] or a 150 mm circular wafer with a diameter of about 50 micron [$2.8*10^{-6}$]). The substrate carrier SC may hold more than one substrate W.

The number of protrusions 1 on the substrate carrier SC may be any suitable number. For example, the number of protrusions 1 may be of the order of ten, one hundred or one thousand. Preferably the protrusions are sufficient in number to provide a uniform support for the substrate W, but small enough in area to minimize the contact area between the protrusions and the substrate (i.e. so that the area covered by the dielectric is large, so that the electrostatic force generated is large). The total surface area of the protrusions 1 may be less than or equal to 2% of the surface area of the substrate carrier SC.

The use of electrostatic forces to hold a substrate W in position ensures a uniform holding force is applied, which is a substantial improvement over the bonding techniques of known lithographic apparatus. A substrate carrier SC employing an electrostatic force to hold a substrate W is easier to use than conventional bonding techniques, in that an electrostatic force may be easily applied and removed, allowing the substrate W to be easily and quickly held by the substrate carrier SC, repositioned on the substrate carrier SC and removed from the substrate carrier SC.

The substrate carrier SC may provide a mechanical support for the substrate W. Additionally, the substrate carrier SC may also allow the substrate W to be indirectly handled, which may reduce contamination of the substrate W, and/or the probability of it becoming damaged.

While specific embodiments of the invention have been described above, it will be appreciated that the invention may be practiced otherwise than as described. The description is not intended to limit the invention.

What is claimed is:

1. A lithographic apparatus comprising:
   a substrate carrier arranged to hold a substrate in position using an electrostatic force, the substrate carrier comprises a first layer of material and a second layer of material that is electrically insulated from the first layer of material, the substrate carrier being provided with an integral power source configured to provide a potential difference between the first layer of material and the second layer of material; and
   a substrate table for holding the substrate carrier.

2. A lithographic apparatus as claimed in claim 1, wherein the integral power source is a battery.

3. A lithographic apparatus as claimed in claim 2, wherein the integral power source is a polymer battery.

4. A lithographic apparatus as claimed in claim 2, further comprising a charging apparatus arranged to charge the battery.

5. A lithographic apparatus as claimed in claim 4, wherein the charging apparatus is an induction coil.

6. A lithographic apparatus as claimed in claim 1, wherein the substrate carrier is substantially the same thickness as the substrate.

7. A lithographic apparatus as claimed in claim 1, wherein the substrate carrier is thinner than the substrate.

8. A lithographic apparatus as claimed in claim 1, wherein the substrate table is arranged to hold the substrate carrier using a vacuum.

9. A lithographic apparatus as claimed in claim 1, wherein the substrate carrier is provided with a planar surface with an array of protrusions protruding therefrom.

10. A lithographic apparatus as claimed in claim 1, wherein the substrate carrier is arranged to hold irregularly sized substrates.

11. A lithographic apparatus as claimed in claim 1, wherein the integral power source is movable simultaneously with the substrate carrier.

12. A lithographic apparatus as claimed in claim 1, wherein the first layer of material comprises a metal, and wherein the second layer of material comprises a diamond-like carbon.

13. A lithographic apparatus as claimed in claim 12, wherein the substrate carrier comprises a plurality of protrusions configured to support the substrate, and wherein the second layer of material covers the plurality of protrusions.

14. A substrate carrier arranged to hold a substrate in position using an electrostatic force, the substrate carrier comprising a first layer of material and a second layer of material that is electrically insulated from the first layer of material, wherein the substrate carrier is provided with an integral power source configured to provide a potential difference between the first layer of material and the second layer of material.

15. A substrate carrier as claimed in claim 14, wherein the integral power source is a battery.

16. A substrate carrier as claimed in claim 15, wherein the battery is a polymer battery.

17. A substrate carrier as claimed in claim 14, wherein the integral power source is configured to be simultaneously movable with the substrate carrier.

18. A substrate carrier as claimed in claim 14, wherein the first layer of material comprises a metal, and wherein the second layer of material comprises a diamond-like carbon.

19. A substrate carrier as claimed in claim 18, further comprising a plurality of protrusions configured to support the substrate, wherein the second layer of material covers the plurality of protrusions.

* * * * *